US007733726B2

(12) United States Patent
La Rosa

(10) Patent No.: US 7,733,726 B2
(45) Date of Patent: Jun. 8, 2010

(54) SENSE AMPLIFIER FOR NON-VOLATILE MEMORIES

(75) Inventor: Francesco La Rosa, Rousset (FR)

(73) Assignee: STMicroelectronics SA, Montrouge (FR)

( * ) Notice: Subject to any disclaimer, the term of this patent is extended or adjusted under 35 U.S.C. 154(b) by 239 days.

(21) Appl. No.: 12/016,615

(22) Filed: Jan. 18, 2008

(65) Prior Publication Data

US 2008/0175075 A1    Jul. 24, 2008

Related U.S. Application Data

(63) Continuation-in-part of application No. PCT/FR2006/001686, filed on Jul. 11, 2006.

(30) Foreign Application Priority Data

Jul. 18, 2005   (FR) .................................. 05 07592

(51) Int. Cl.
  *G11C 7/00* (2006.01)
(52) U.S. Cl. .................. 365/205; 365/201; 365/189.09; 365/189.15

(58) Field of Classification Search .................. 365/207, 365/205, 201, 189.09, 189.15
See application file for complete search history.

(56) References Cited

U.S. PATENT DOCUMENTS

| 5,544,110 | A | 8/1996 | Yuh |
| 5,754,010 | A | 5/1998 | Caravella et al. |
| 5,946,241 | A | 8/1999 | Zink et al. |
| 6,760,265 | B2 * | 7/2004 | La Rosa ..................... 365/207 |
| 7,027,341 | B2 * | 4/2006 | Morikawa ................... 365/203 |
| 7,031,212 | B2 * | 4/2006 | La Rosa ..................... 365/205 |
| 7,193,898 | B2 * | 3/2007 | Cernea .................. 365/185.22 |

* cited by examiner

*Primary Examiner*—Tuan T Nguyen
*Assistant Examiner*—Toan Le
(74) *Attorney, Agent, or Firm*—Lisa K. Jorgenson; Timothy L. Boller; Seed IP Law Group PLLC

(57) ABSTRACT

A sense amplifier for reading a memory cell, including a read node linked to the memory cell, and an active circuit structured to maintain a voltage appearing on the read node at a value inferior to a value of a selection transistor threshold voltage.

24 Claims, 4 Drawing Sheets

SENSE AMPLIFIER FOR NON-VOLATILE MEMORIES

CROSS-REFERENCE TO RELATED APPLICATION

This application is a continuation-in-part of International Patent Application No. PCT/FR2006/001686, filed Jul. 11, 2006, now pending, which application is incorporated herein by reference in its entirety.

This application claims the benefit under 35 U.S.C. §119 (a) of French Patent Application No. 05 07592, filed Jul. 18, 2005, from which priority was claimed in the International Patent Application No. PCT/FR2006/001686, and which is also incorporated herein by reference in its entirety.

BACKGROUND OF THE INVENTION

1. Field of the Invention

The present invention relates to a memory cell sense amplifier.

2. Description of the Related Art

The present invention more particularly relates to a sense amplifier comprising a read node directly or indirectly linked to a memory cell, an active stage connected to the read node and comprising means for supplying a read current to the read node, and a data output linked to the output of a comparator which compares to a reference voltage the voltage present on a node of the active stage, this voltage being representative of the state of conductivity of the memory cell.

The present invention particularly, but not exclusively applies to non-volatile memories, like EEPROM and FLASH EEPROM memories, and more particularly to PCM memories (phase change memory). In these memories, each memory cell can take two distinct states, i.e., an erased state and a programmed state. In phase change memories, each memory cell comprises an alloy able for example to take a crystalline state and an amorphous state, passing from one to the other being made by cycles for heating/cooling the alloy, in particular according to the duration of the cycle for cooling or heating.

Classically, a sense amplifier is used to detect the programmed or erased state of a memory cell of a non-volatile memory, by comparing the value of a current flowing through the memory cell to a reference current. The fact that the memory cell is programmed or erased is rendered indeed by a determined state of conductivity of the memory cell, and corresponds by convention to a determined value of the datum stored by the memory cell, for example 1 for the programmed state and 0 for the erased state.

FIG. 1 schematically shows a standard architecture of a sense amplifier SA1 of a non-volatile memory. On this figure and in the description of the present invention, the transistors of the PMOS type are indicated by references beginning with "TP" and the NMOS transistors are indicated by references beginning with "TN". The sense amplifier SA1 comprises a control stage CST1, a read stage RST1 comprising a read node Sin, and an output stage OST comprising a data output Sout, these stages being electrically powered by a voltage Vcc.

The control stage CST1 comprises transistors TP1 and TP2 mounted in series with parallel-connected transistors TN2 and TN1. The transistor TP1 receives on its source terminal the voltage Vcc, and on its gate terminal a reference voltage Vrefp. The drain terminal of the transistor TP1 is connected to the source terminal of the transistor TP2. A control signal EN1 is applied to the control gate of the transistors TP2 and TN2. The drain terminal of the transistor TP2 is connected to the drain terminals of the transistors TN1 and TN2 which source terminals are put to the ground. The gate terminal of the transistor TN1 is connected to the read node Sin.

The read stage RST1 comprises two transistors TP3 and TN3 mounted in series. The transistor TP3 receives the voltage Vcc on its source terminal and the voltage Vrefp on its gate terminal. The drain terminal of the transistor TP3 and the drain terminal of the transistor TN3 are connected to a node N1 which is connected to the input of the output stage OST.

The source terminal of the transistor TN3 is connected to the read node Sin, on which a voltage Vs called "read voltage" appears. The gate terminal of the transistor TN3 is connected to a node CH which receives a voltage V(CH) taken from the drain terminal of the transistor TP2 of the control stage CST1. The read stage further comprises a precharge transistor TN4 mounted in parallel with the transistor TP3 and which drain terminal receives the voltage Vcc. The gate and the source terminals of the transistor TN4 are respectively connected to the data output Sout of the sense amplifier SA1, and to the node N1.

The output stage OST comprises a comparator CP comprising a positive output receiving the voltage Vrefp and a negative input receiving a voltage V(N1) present on the node N1. The output of the comparator which forms the data output Sout of the sense amplifier, is in addition connected to the gate terminal of the transistor TN4.

On FIG. 1, the read node Sin is linked to a non-volatile memory cell MC(i,j,k) of a memory array MA (only one memory cell is shown for the sake of simplicity), for example by means of a word column k selection transistor TS(k) and of a bit line BL(j,k). The transistors TS(k) are driven by a column selection signal SEL(k) from a column decoder (not shown). As an example application, the memory cell belongs to an EEPROM memory, and thus comprises a floating gate transistor which source terminal is linked to the ground and which gate terminal receives a read voltage Vr during a read phase. The threshold voltage of the floating gate transistor depends on its programmed or erased state and the read voltage Vr is chosen between the threshold voltage at the programmed state and the threshold voltage at the erased state. Thus, when the read voltage Vr is applied, the floating gate transistor is highly conducting if it is in the programmed state (low threshold voltage), or conversely little conducting, or even blocked if it is in the erased state (high threshold voltage).

The sense amplifier is inactive when the signal EN1 is 1 (=Vcc) and the voltage Vrefp is equal to Vcc. The transistor TN2 is then conducting. The transistor TP2 is blocked, and the drain terminal of the transistor TN1 is linked to the ground. Therefore, there is no current flowing through the control stage CST1. The transistors TP1 and TP3 are blocked and there is no current flowing through the read stage RST1.

The reading of a memory cell MC(i,j,k) is preceded by a phase of address decoding, performed by the column decoder, making it possible to link the bit line BL(j,k) of the memory cell to the read node Sin of the sense amplifier.

The reading of the memory cell comprises a phase of precharging the bit line BL(j,k), and a phase of reading the datum memorized in the memory cell. The read voltage Vr is applied from the precharge phase to the gate terminal of the floating gate transistor of the memory cell to be read. The sense amplifier SA1 is first activated by bringing the voltage Vrefp to the value Vcc−Vtp, where Vtp is the threshold voltage of the PMOS transistors. The transistors TP1 and TP3 then operate as current generators and respectively supply currents Ib and Ir in their respective stages.

The precharge phase is started by setting the signal EN1 to 0. The transistor TN2 blocks and the transistor TP2 becomes conducting. The voltage V(CH) on the node CH which is applied to the gate terminal of the transistor TN3 increases and the latter becomes conducting. The transistors TP3 and TN4 are also conducting (the voltage V(Sout) at the data output Sout is at the high level), and a precharge current is supplied to the read node Sin. The transistor TN4 is used to accelerate the precharge phase and consequently, to diminish the global read time, by supplying a current Ifb which adds to the current Ir supplied by the transistor TP3. The precharge current, equal to Ir+Ifb, is used to charge stray capacitances located in the bit line BL(j,k) and to rapidly bring the read voltage Vs to a determined value which is substantially equal to the threshold voltage Vtn of the NMOS transistors. In addition, the limitation of the voltage Vs, performed by the transistor TN3 allows the floating gate transistor of the memory cell to be protected against a phenomenon called "drain stress", which is rendered by an involuntary injection of charges into the floating gate causing a parasitic programming of the memory cell.

When the determined value of the read voltage Vs is reached, the transistor TN1 becomes conducting. The voltage V(CH) on the node CH decreases and stabilizes at a value such that, on the one hand, the currents in the transistors TP1 and TN1 are identical, and on the other hand, the current supplied by the transistor TN3 to the read node corresponds to the current Ic imposed by the memory cell currently being read.

At the end of the precharge phase, the voltage V(N1) on the node N1 is near the voltage Vrefp. There are two possible situations: either the memory cell is programmed and a 1 must be read by the sense amplifier, or the memory cell is erased and 0 must be read. If a 1 must be read, the cell current Ic is superior to the reference current Ir. The voltage V(N1) on the node N1 remains slightly inferior to the voltage Vrefp. The signal supplied by the comparator CP on the data output Sout of the sense amplifier remains at a level of voltage high enough to maintain the transistor TN4 in the conducting state. The transistor TN4 then supplies a current equal to the difference Ic-Ir between the current Ic imposed by the memory cell and the reference current Ir supplied by the transistor TP3.

If a 0 must be read, the current Ic in the memory cell to be read is lower than the reference current Ir. In that case, the voltage V(N1) on the node N1 increases to a level higher than the voltage Vrefp. The signal on the data output Sout then goes to the low state.

It turns out that this type of detection circuit has a limitation due to the fact that the voltage Vs on the read node Sin, which corresponds to the voltage of the bit line BL(j,k), must be forced to a value slightly superior to the threshold voltage Vtn (typically ranging from 0.8 V to 1 V), because of a slight over-voltage required by the transistor TN1 to supply the current Ib. However, in certain applications, the bit line must be biased to a level lower than this threshold voltage to reduce the constraints caused by the current Ic flowing through the memory cell, which could damage data integrity.

In particular, in PCM memories, the current Ic flowing through a memory cell during a read phase should be limited so as to reduce the heating of the memory cell, and thus avoid undesirable thermal effects that may particularly cause the recrystallization of the phase change material from its amorphous state, and thus a corruption of memorized data.

To reduce the read voltage Vs applied to the read node, the threshold voltage Vtn may be reduced. However, this voltage constitutes a technological parameter of the NMOS transistors of the sense amplifier. In fact, this parameter is linked to the manufacturing technique used to make the amplifier, and is substantially invariant for a given manufacturing technique.

BRIEF SUMMARY OF THE INVENTION

One embodiment of the present invention provides a sense amplifier used to control the voltage applied to the bit line without being limited by the threshold voltage Vtn.

One embodiment of the present invention is a sense amplifier for reading a memory cell, made with MOS transistors having a threshold voltage forming a technological parameter of the sense amplifier, and comprising:

a read node linked to the memory cell, an active stage connected to the read node and comprising means for supplying a read current on the read node, and a data output linked to a node of the active stage where an electric voltage appears, which is representative of the state of conductivity of the memory cell.

The sense amplifier also comprises means for maintaining a voltage appearing on the read node at a value inferior to the threshold voltage.

According to one embodiment of the invention, the means for maintaining the voltage of the read node at a value inferior to the threshold comprise:

a first transistor and a second transistor arranged in series in the active stage, the second transistor being linked to the read node, and means for applying to the gate terminals of the first and second transistors gate voltages having a controlled potential difference one relative to the other.

According to one embodiment of the invention, the sense amplifier comprises a control stage biased by a bias current and arranged for applying to the gate terminals of the first and the second transistors gate voltages having a potential difference, one relative to the other, which is determined by a current flowing through a resistance.

According to one embodiment of the invention, the sense amplifier comprises means for generating the bias current flowing through the resistance, independently from a current flowing through the active stage.

According to one embodiment of the invention, the means for generating the bias current flowing through the charge comprise a resistor through which the bias current is generated, the voltage Vs applied to the read node complying with the following relationship:

$$Vs = Vtn$$

where Vtn is the threshold voltage, R1 is the impedance value of an impedance and R11 is the value of the resistor of the current generation means.

According to one embodiment of the invention, the sense amplifier comprises means for limiting the voltage drop in the resistance during a phase of precharging the read node.

According to one embodiment of the invention, the means for limiting the voltage drop in the resistance comprise a transistor mounted in parallel with the resistance, controlled by the voltage on the read node.

According to one embodiment of the invention, the resistance comprises at least one element of the group comprising a resistor and a MOS transistor.

According to one embodiment of the invention, the sense amplifier comprises means for discharging a connection node between the first and the second transistors, and thus avoiding a blocking situation.

According to one embodiment of the invention, the means for discharging the connection node between the first and the second transistors, comprise a transistor connected between the node and the ground.

According to one embodiment of the invention, the sense amplifier comprises means for attenuating oscillations appearing in the node.

According to one embodiment of the invention, the active stage comprises a first current generator linked to the read node through the first and the second transistors, and the control stage comprises a second current generator supplying the bias current flowing through the charge.

According to one embodiment of the invention, the sense amplifier comprises means for activating the sense amplifier before a phase for precharging the read node.

According to one embodiment of the invention, the means for activating the sense amplifier before a phase of precharging the read node comprise means for disconnecting the sense amplifier from the read node during the activation of the sense amplifier.

One embodiment of the invention is a non-volatile memory comprising at least one memory cell. The memory comprises at least one sense amplifier as defined above, for reading the memory cell.

BRIEF DESCRIPTION OF THE SEVERAL VIEWS OF THE DRAWING(S)

These and other advantages and features of the present invention will be presented in greater detail in the following description of the invention given in relation with, but not limited to the following figures:

FIG. 1 previously described is the electrical diagram of a standard sense amplifier of a memory cell;

DETAILED DESCRIPTION OF THE INVENTION

Figure 1:
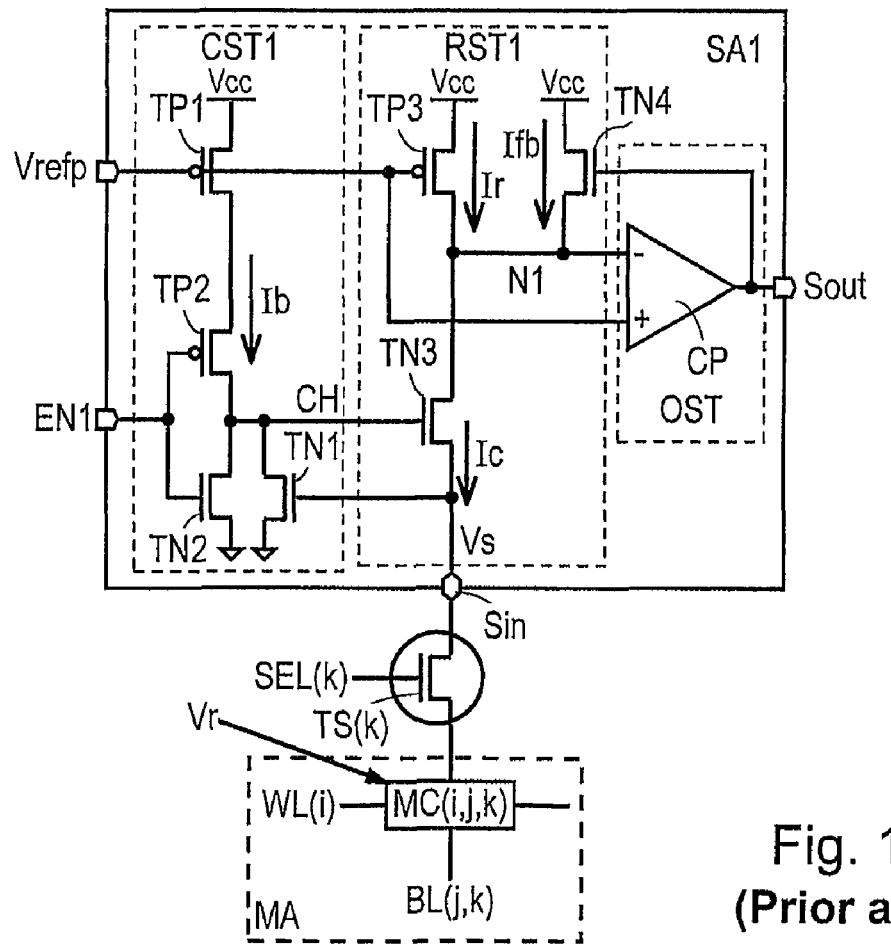
Figure 2:
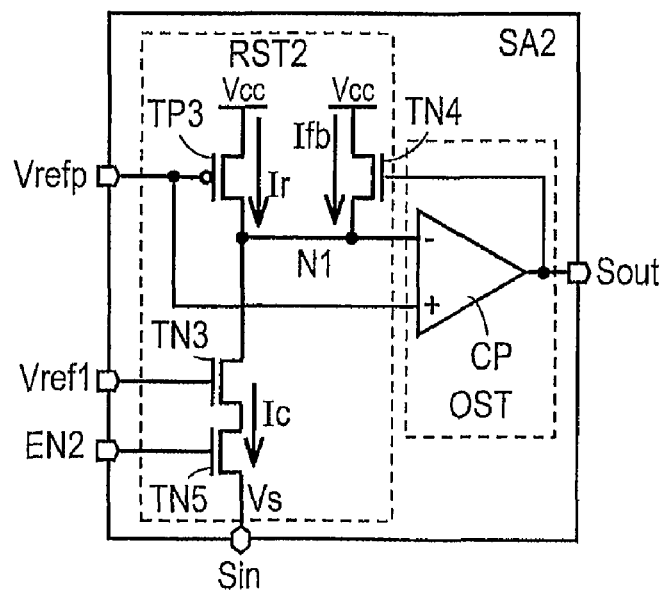
FIGS. 2 to 6 are electrical diagrams of various embodiments of sense amplifiers of a memory cell, according to the present invention.

FIG. 2 shows a sense amplifier SA2 comprising a read stage RST2 derived from the one of the sense amplifier SA1 described with reference to FIG. 1, and an output stage OST identical to the one of the sense amplifier SA1. The elements previously described with reference to FIG. 1 are indicated with the same references.

The read stage RST2 is connected to a read node SIN, and to an input node N1 of the output stage OST which comprises a data output Sout, these stages being electrically powered by a voltage Vcc.

As in FIG. 1, the read node Sin is linked to a memory cell through a selection transistor controlled by a column decoder, and a bit line (not shown). The memory cell receives a read voltage Vr comprised between a threshold voltage in the programmed state of the memory cell and a threshold voltage in the erased state. The output Sout supplies a signal at high or low level according to the state of conductivity of the memory cell, that is approximately and respectively the voltage Vcc or the ground potential, because they are not pure logic potentials. The output signal is then converted in "pure" CMOS logic levels by an inverter (not shown).

The read stage RST2 comprises, like the read stage RST1, transistors TP3 and TN3 mounted in series, and a transistor TN4 mounted in parallel with the transistor TP3. The voltage Vcc is applied to the drain terminal of the transistor TN4 and the source terminal of the transistor TP3 which gate terminal receives the voltage Vrefp. The drain terminals of the transistors TP3 and TN3, and the source terminal of the transistor TN4 are connected to the input node N1 of the output stage OST.

The read stage RST2 further comprises a transistor TN5 mounted in series between the transistor TN3 and the read node Sin, to achieve with the transistor TN3 a cascode arrangement. The gate terminal of the transistor TN3 is controlled by a fixed voltage Vref1. The source terminal of the transistor TN3 is connected to the drain terminal of the transistor TN5 which source terminal is connected to the read node Sin and which gate terminal receives a control voltage EN2. The control voltage EN2 is chosen such that the transistor TN5 operates like a switch to disconnect the read node Sin of the selection transistor TS(k) (FIG. 1) before the column selection.

The voltage Vs at the read node Sin is equal to Vref1−VTn. It is therefore directly controlled by the voltage Vref1, and can thus be lower than the threshold voltage Vtn, if the voltage Vref1 is fixed at a value inferior to 2VTn. The transistor TN5 therefore allows the read voltage Vs to be reduced beyond the limit imposed by the threshold voltage Vtn of the NMOS transistors, determined by the manufacturing technique used.

Figure 3:
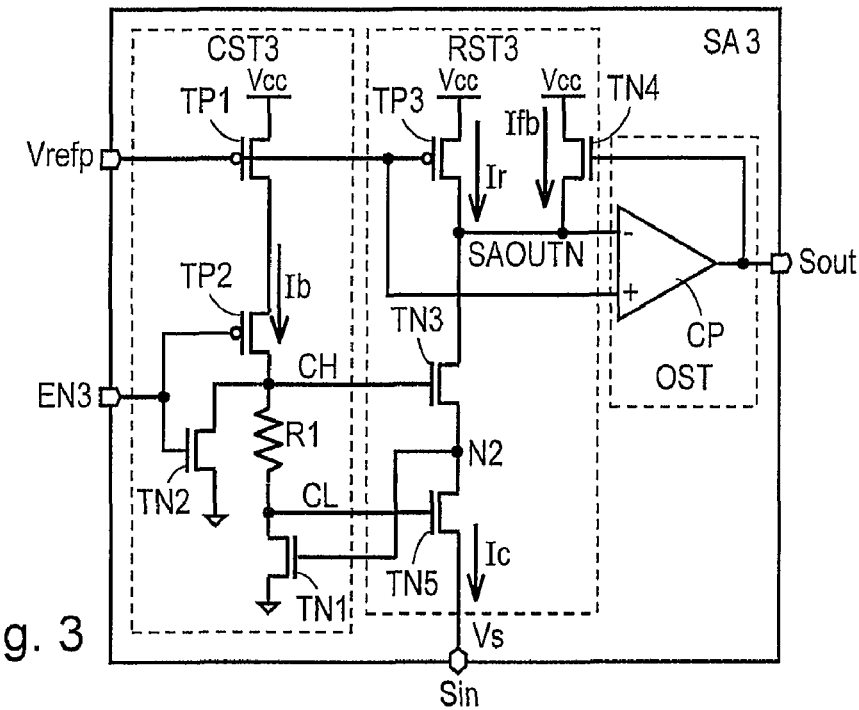

FIG. 3 shows another advantageous embodiment of a sense amplifier according to the invention. The elements previously described with reference to FIGS. 1 and 2 are indicated by the same references.

The sense amplifier SA3 shown in FIG. 3 comprises a control stage CST3, a read stage RST3 and an output stage OST. The output stage is identical to the output stage shown in FIG. 1 previously described.

The sense amplifier SA3 is controlled by an activation signal EN3, and comprises a read node Sin for linking the bit line of the memory cell to be read (not shown), and a data output Sout supplying a signal at high or low level according to the state of conductivity of the memory cell.

The read stage RST3 comprises the same components, substantially arranged in the same way as in the stage RST2 previously described.

The read stage RST3 comprises a transistor TN5 arranged in series between the source terminal of the transistor TN3 (node N2) and the read node Sin. The drain and the source terminals of the transistor TN5 are respectively connected to the node N2 and the read node Sin.

In addition, the gate terminals of the transistors TN3 and TN5 are respectively connected to nodes CH and CL of the control stage CST3.

Like the stage CST1 previously described with reference to FIG. 1, the control stage CST3 comprises transistors TP1 and TP2 mounted in series with parallel-connected TN1 and TN2. Thus, the transistor TP1 receives the voltage Vcc on its source terminal and the voltage Vrefp on its gate terminal. The drain terminal of the transistor TP1 is connected to the source terminal of the transistor TP2. The transistors TP2 and TN2 receive an activation signal EN3 on their gate terminals. The gate terminal of the transistor TN1 is connected to the node N2.

Advantageously, a resistor R1 is arranged in series between the drain terminal of the transistor TP2 (node CH) and the drain terminal of the transistor TN1 (node CL). The difference of potential between the nodes CH and CL is thus equal to the voltage drop between the terminals of the resistor R1.

The transistors TN3 and TN5 of the read stage RST3 form a cascode arrangement wherein the transistor TN5 is controlled by a gate voltage equal to the voltage V(CL) on the node CL, which is inferior to the voltage V(CH) on the node CH applied to the gate terminal of the transistor TN3.

The sense amplifier SA3 is activated by bringing the voltage Vrefp to a value equal to Vcc−Vtp (where Vtp is the threshold voltage of a PMOS transistor), and the precharge phase starts by setting the signal EN3 to 0. The transistors TP1 and TP3 operate like current generators and respectively supply the currents Ib and Ir in their respective stages. As a result, the transistor TN2 blocks and the transistor TP2 becomes conducting. The voltage V(CH) at the node CH increases and the transistor TN3 becomes conducting.

The transistor TN4 supplies the main part of the precharge current Ifb (assumed to be high compared to Ir) to the read node Sin. When the read voltage Vs reaches a determined value, the transistor TN1 becomes conducting. The voltage on the gate terminal of the transistor TN3 stabilizes. The currents in the transistors TP1 and TN1 are identical.

The operation of the sense amplifier SA3 is substantially identical to the one of the amplifier SA1 described with reference to FIG. 1. However, the operating point of this circuit is such that the voltage on the source terminal of the transistor TN3, which controls the transistor TN1, forces it to supply a current equal to the current Ib controlled by the transistor TP1. This current flowing through the resistor R1, the voltage V(CL) at the node CL can be determined in the following way:

$$V(CL)=V(CH)-Ib \times R1 = 2\,Vtn - Ib \times R1 \quad (1)$$

It results that the read voltage Vs at the read node Sin complies with the following relationship:

$$Vs = V(CL) - Vtn = Vtn - Ib \times R1 \quad (2)$$

The read voltage Vs is thus reduced compared to the threshold voltage Vtn by a value equal to Ib×R1. This reduction can thus be easily controlled by setting either the value of the current Ib, or the value of the resistor R1.

The combination of the control stage CST3 wherein the resistor R1 has been added, and the addition of the transistor TN5 in the read stage RST3 thus allows the read voltage Vs to be reduced beyond the limit imposed by the threshold voltage Vtn of the NMOS transistors of the sense amplifier.

Compared to the sense amplifier SA2, the voltage Vs at the read node Sin in the sense amplifier SA3 is less linked to the current Ic, and the precharge phase of the bit line is less long.

Figure 4:
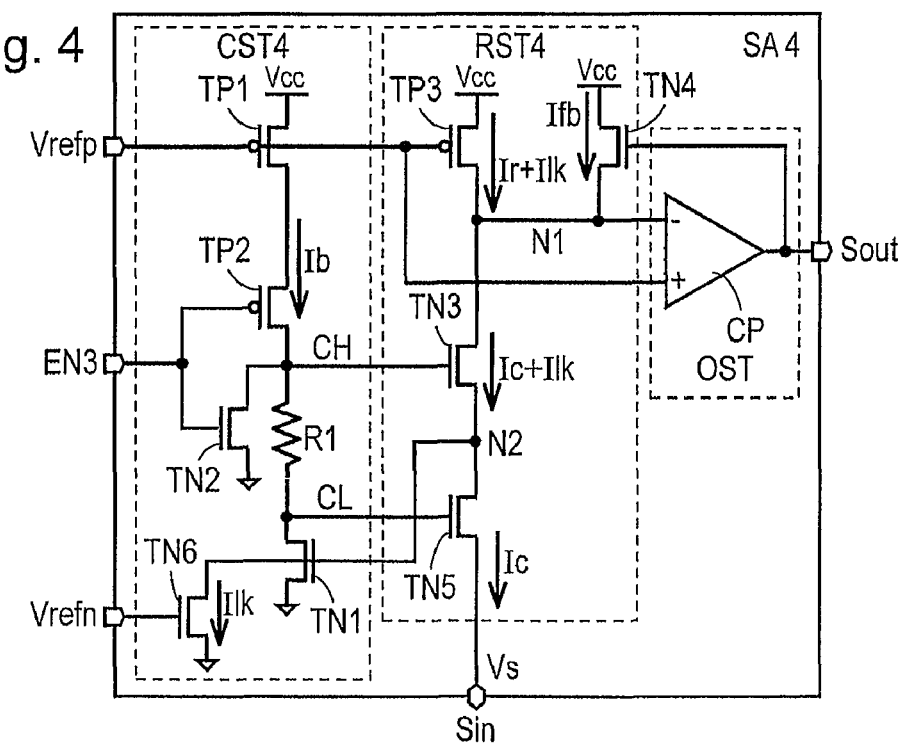

FIG. 4 shows a sense amplifier SA4 according to another embodiment of the invention. The sense amplifier SA4 comprises read stages RST4 and output stages OST identical to those of the sense amplifier SA3, and a control stage CST4 comprising all the components of the control stage CST3, substantially arranged in the same way. The control stage CST4 further comprises an additional transistor TN6 which gate terminal is controlled by a reference voltage Vrefn equal to Vtn. The source terminal of the transistor TN6 is put to the ground, and its drain terminal is connected to the connection node N2 of the transistors TN3, TN5 and TN1.

The transistor TN6 behaves like a current source, calling to its drain terminal a leakage current Ilk. The effect of this current which adds to the current Ic can be easily compensated by increasing by the same value the current Ir flowing through the transistor TP2.

This arrangement makes it possible to avoid an overshoot wherein the node N2 cannot discharge.

Figure 5:
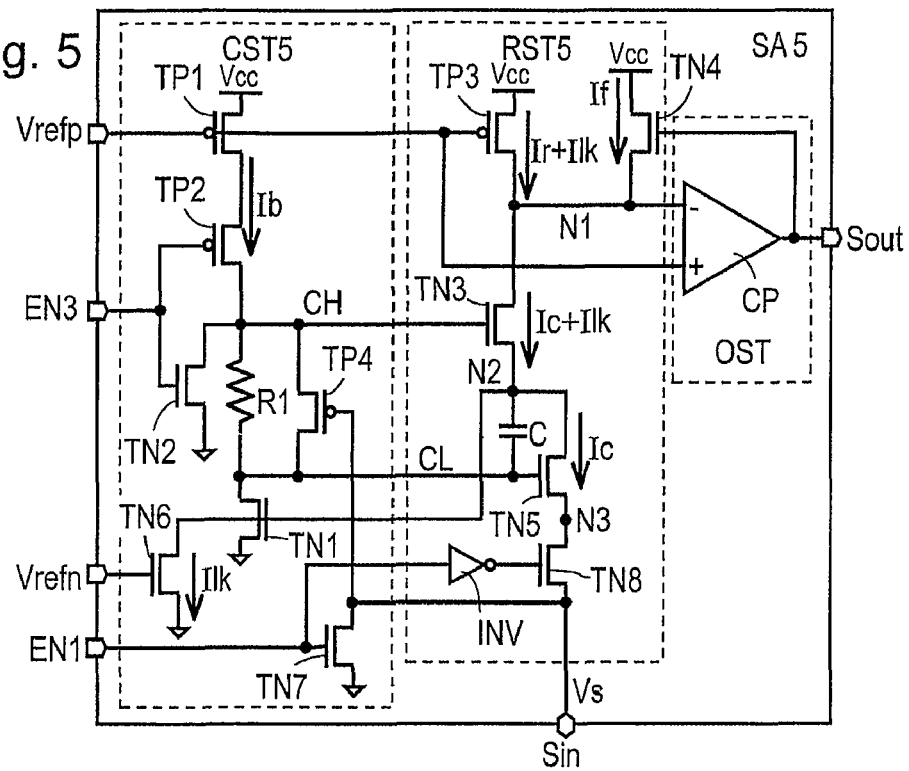

FIG. 5 shows a sense amplifier SA5 according to another embodiment of the invention. The sense amplifier SA5 comprises a control stage CST5, a read stage RST5 and an output stage OST, the latter being identical to the one of the amplifier described with reference to FIG. 1. The stages CST5 and RST5 comprise all the components of the stages CST4 and RST4 of the sense amplifier SA4, substantially arranged in the same way. The control stage CST5 further comprises an additional transistor TP4 mounted in parallel with the resistor R1. The gate terminal of the transistor TP4 is connected to the read node Sin, and is linked to the ground through a transistor TN7. The gate terminal of the transistor TN7 is controlled by a signal EN1, and the drain and the source terminals of this transistor are respectively connected to the read node Sin and to the ground.

The read stage RST5 further comprises a capacitor C and an additional transistor TN8. The capacitor C is mounted between the node N2 and the gate terminal of the transistor TN5 to suppress or attenuate undesired current oscillations. The drain and the source terminals of the transistor TN8 are respectively connected to the source terminal of the transistor TN5 (node N3) and to the read node Sin. The gate terminal of the transistor TN8 is controlled by the signal EN1 through an inverter INV, so that when the transistor TN7 is conducting, the transistor TN8 is blocked, and vice versa.

By maintaining the signal EN1 to 1 before the column of the memory array is selected, the transistor TN8 is blocked and insulates the read node Sin. The column selection transistor TS(k) (FIG. 1) is thus isolated from the rest of the sense amplifier SA5, which allows it to be set into its state of operation before the selection of the column of the memory array. When the sense amplifier SA5 is thus disconnected from the column selection transistor by the transistor TN8, the transistor TN7 is conducting and puts the read node Sin to the ground.

The sense amplifier SA5 is therefore activated before an operation of reading a memory cell by setting the signal EN3 to 0 and the signal EN1 to 1. In these conditions, no current Ic can flow through the read node Sin, and the voltages internal to the sense amplifier have the following values:

$$V(N2)=Vtn \text{ (voltage on the node } N2)$$

$$V(N3)=Vtn-Ib \times R1 \text{ (voltage on the node } N3)$$

$$Vs=0$$

$$V(N1)=Vcc \text{ (voltage on the node } N1)$$

$$V(Sout)=0 \text{ (voltage on the data output } Sout)$$

As soon as the signal EN1 goes to 0, a high current flows through the transistors TN3, TN5 and TN8, this current being necessary for charging the capacitance of the bit line and the column decoder. The voltage of the nodes N1, N2 and N3 then rapidly drops. It results that the output signal Sout goes to 1, which renders conducting the transistor TN4 which supplies the current Ifb necessary for the precharge, and which cannot be supplied by the transistor TP3 alone. The drop of the voltage V(N2) of the node N2 triggers the reaction of the feedback circuit which increases the voltage V(CH) at the node CH. The transistor TP4 which is then conducting, limits the voltage drop in the resistor R1 during this phase, and thus accelerates the control of the transistor TN5, and therefore the charge of the bit line.

When the read node Sin is charged at the required value, the sense amplifier SA5 has reached its operating point. The increase of the read voltage Vs which is followed by the drop of the voltage CH, reduces the drain-source voltage of the transistor TP4 to a value such that the current that flows through it is negligible in relation to the current flowing through the resistor R1. The effect of the transistor TP4 therefore disappears during the reading of the datum.

Figure 6:
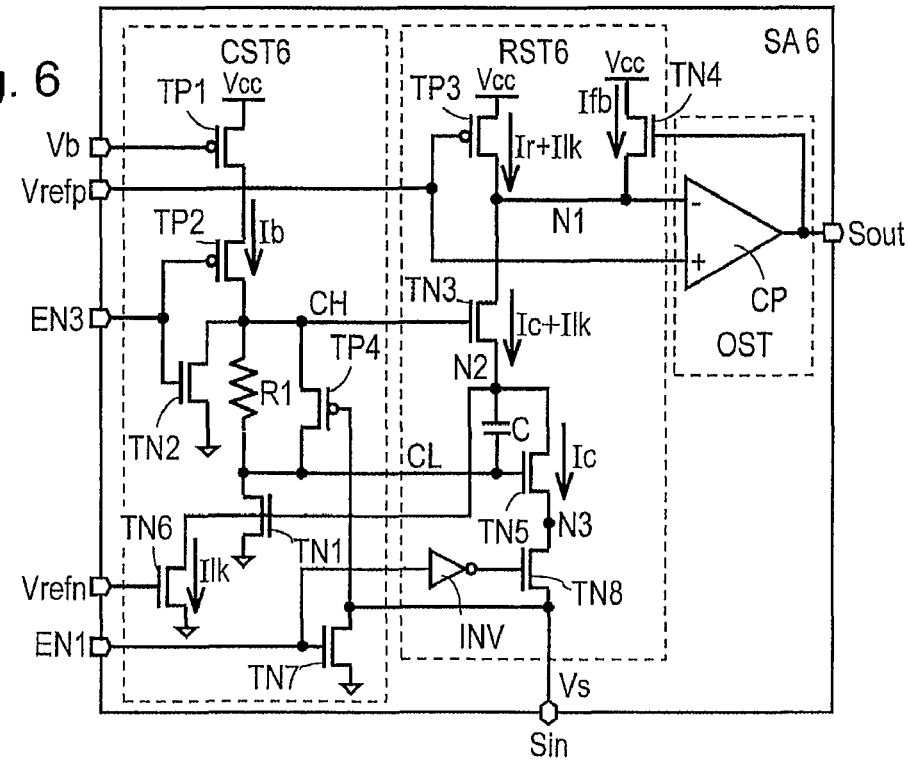

FIG. 6 shows a sense amplifier SA6 according to another embodiment of the invention. The sense amplifier SA6 comprises a control stage CST6, a read stage RST6 and an output stage OST. These stages are identical to those of the sense amplifier SA5, except that in the control stage CST6, the gate terminal of the transistor TP1 is controlled by a voltage Vb distinct from the voltage Vrefp. This arrangement renders the current Ib independent from the current Ir, which allows the voltage drop in the resistor R1 to be better controlled.

Figure 7:
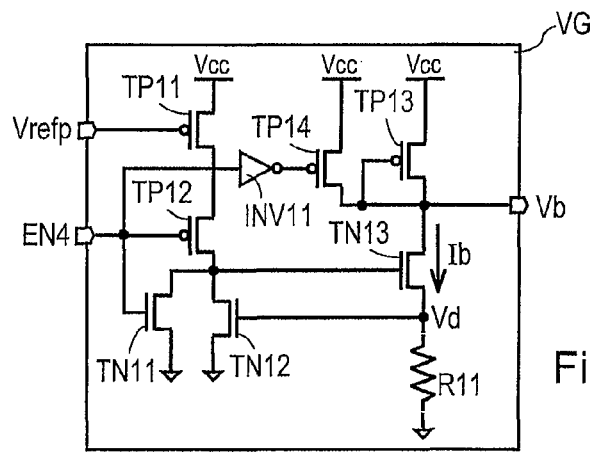
FIG. 7 shows a circuit for generating a control voltage applied to the circuit shown in FIG. 6.

FIG. 7 shows an electrical circuit VG allowing the voltage Vb to be generated. This circuit comprises a first branch comprising two transistors TP11 and TP12 mounted in series. The transistor TP11 receives the voltage Vcc on its source terminal and the control voltage Vrefp on its gate terminal. The drain terminal of the transistor TP12 is connected to the drain terminals of two transistors TN11 and TN12 mounted in parallel and which source terminals are put to the ground. The gate terminals of the transistors TP12 and TN11 are controlled by a signal EN4. The circuit VG comprises a second branch comprising a transistor TP13 mounted in series with a transistor TN13. The source terminal of the transistor TP13 receives the voltage Vcc. The source terminal of the transistor TN13 is connected to the gate terminal of the transistor TN12 and is linked to the ground through a resistor R11. The gate terminal of the transistor TN13 is connected to the drain terminal of the transistor TP12. The second branch further comprises a transistor TP14 which source terminal receives the voltage Vcc, which gate terminal is controlled by the signal EN4 inverted by an inverter INV11, and which drain terminal which supplies the voltage Vb is connected to the gate terminal of the transistor TP13 and to the drain terminals of the transistors TP13 and TN13.

The circuit VG is activated by setting the signal EN4 to 0. The signal Vrefp being equal to Vcc−Vtp, the transistors TP11 and TP12, and the transistors TP13 and TN13 become conducting, whereas the transistors TN11 and TP14 are blocked. The circuit stabilizes at a state of operation such that the voltage Vd at the source terminal of the transistor TN13 and at the gate terminal of the transistor TN12 is equal to Vtn. It results that the current Ib flowing through the transistor TN13 and the resistor R11 is equal to Vtn/R11. With reference to the equation (2), it can be deduced that:

$$Vs = Vtn - Ib \times R1 = Vtn(1 - R1/R11) \quad (3)$$

Thanks to these arrangements, the read voltage Vs applied to the bit line BL(j,k) can be easily set by adjusting the ratio R1/R11.

Figure 8A:
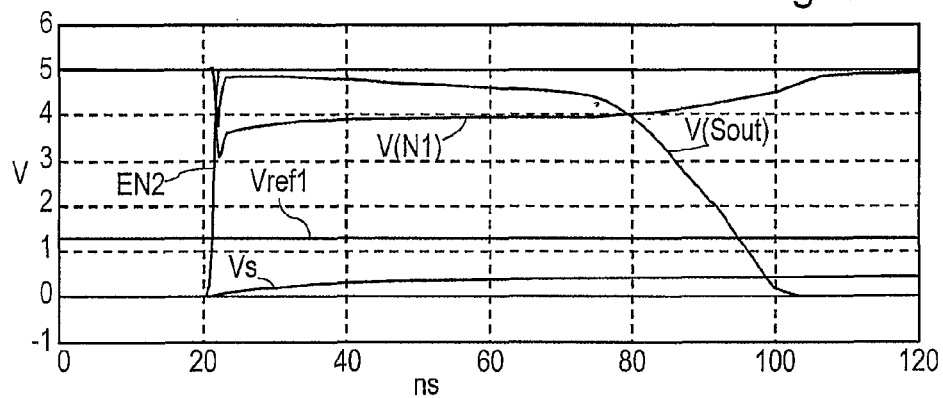
FIGS. 8A and 8B show the aspect of some voltages appearing in the sense amplifier of FIGS. 2 and 6, respectively.
Figure 8B:
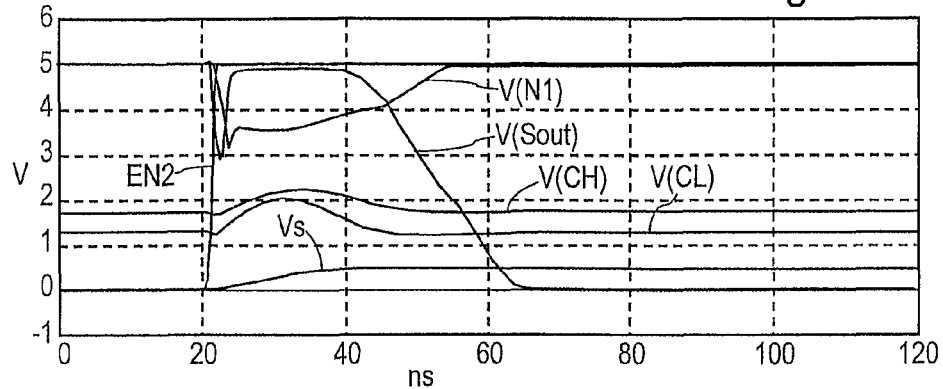

FIGS. 8A and 8B show time variations of voltages respectively present in the amplifiers SA2 and SA6, in the case where the current Ir is lower than the current Ic. FIG. 8A shows variations of the voltages Vs, EN2, Vref1, V(N1) and of the voltage V(Sout) at the data output Sout of the sense amplifier. FIG. 8B shows variations of the voltages Vs, EN2, V(N1) and V(Sout), and the voltages V(CH) and V(CL) on the nodes CH and CL, respectively.

In FIG. 8A, it can be observed that the duration of the charge of the bit line, corresponding to the duration during which the output voltage V(Sout) goes from 5 V to 0 V, is about 80 ns. In FIG. 8B, this duration is about 40 ns.

It results from the comparison of these two figures that the feedback circuit of the sense amplifier SA6 significantly reduces the duration of charge of the bit line, in relation to the solution consisting in biasing the gate terminal of the transistor TN3 by the fixed voltage Vref1.

It will be clear to those skilled in the art that the present invention is susceptible of various embodiments and applications. In particular, the resistor R1 of the control stage CST3, CST4, CST5 or CST6 can be replaced by an active component like a transistor which gate terminal is linked to the ground.

The invention claimed is:

1. A sense amplifier for reading a memory cell, the sense amplifier comprising:
    a read node linked to the memory cell;
    an active stage connected to the read node and comprising means for supplying a read current on the read node using a MOS transistor having a threshold voltage;
    a data output linked to a node of the active stage where a voltage appears which is representative of a state of conductivity of the memory cell; and
    means for maintaining a voltage (Vs) on the read node at a lower value than the threshold voltage, having:
        a first transistor and a second transistor arranged in series in the active stage, the second transistor being linked to the read node; and
        means for applying, to gate terminals of the first and second transistors, respective gate voltages having a controlled potential difference relative to each other.

2. A sense amplifier according to claim 1, comprising a control stage biased by a bias current, the control stage including an impedance having a bias current flowing therethrough that determines the potential difference between the gate voltages applied to the first and second transistors.

3. A sense amplifier according to claim 2, comprising means for generating the bias current flowing through the impedance independently from a current flowing through the active stage.

4. A sense amplifier according to claim 3, wherein the means for generating the bias current flowing through the impedance comprise a resistor through which the bias current is generated, the voltage Vs on the read node complying with the following relationship:

$$Vs = Vtn(1 - R1/R11)$$

where Vtn is the threshold voltage, R1 is an impedance value of the impedance and R11 is a resistance value of the resistor.

5. A sense amplifier according to claim 2, comprising means for limiting a voltage drop in the impedance during a phase of precharging the read node.

6. A sense amplifier according to claim 5, wherein the means for limiting the voltage drop in the impedance comprise a transistor mounted in parallel with the impedance, controlled by the voltage on the read node.

7. A sense amplifier according to claim 2, wherein the impedance comprises an element of the group comprising a resistor and a transistor.

8. A sense amplifier according to claim 2, comprising means for discharging a connection node between the first and the second transistors, and thus avoiding a blocking situation.

9. A sense amplifier according to claim 8, wherein the means for discharging the connection node between the first and the second transistors comprise a transistor connected between the connection node and ground.

10. A sense amplifier according to claim 8, comprising means for attenuating oscillations appearing in the connection node.

11. A sense amplifier according to claim 10 wherein said means for attenuating oscillations comprise a capacitor connected to said connection node.

12. A sense amplifier according to claim 2, wherein the active stage comprises:
    a first current generator coupled to the read node through said first and second transistors; and the control stage comprises a second current generator supplying the bias current flowing through the impedance.

13. A sense amplifier according to claim 1, comprising means for activating the sense amplifier before a phase for precharging the read node.

14. A sense amplifier according to claim 13, wherein the means for activating the sense amplifier before the phase of precharging the read node comprise means for disconnecting the sense amplifier from the read node during the activation of the sense amplifier.

15. A non-volatile memory, comprising:
a memory cell; and
a sense amplifier for reading the memory cell, wherein the sense amplifier comprises:
   a read node linked to the memory cell;
   an active stage connected to the read node and comprising means for supplying a read current on the read node using a MOS transistor having a threshold voltage;
   a data output linked to a node of the active stage where a voltage appears which is representative of a state of conductivity of the memory cell; and
   means for maintaining a voltage (Vs) on the read node at a lower value than the threshold voltage, having:
      a first transistor and a second transistor arranged in series in the active stage, the second transistor being linked to the read node; and
      means for applying, to gate terminals of said first and second transistors, respective gate voltages having a controlled potential difference relative to each other.

16. A non-volatile memory according to claim 15, wherein the sense amplifier comprises a control stage biased by a bias current, the control stage including an impedance having a bias current flowing through that determines the potential difference between the gate voltages applied to the first and second transistors.

17. A non-volatile memory according to according to claim 16, wherein the sense amplifier comprises means for generating the bias current flowing through the impedance independently from a current flowing through the active stage.

18. A non-volatile memory according to claim 17, wherein the means for generating the bias current flowing through the impedance comprise a resistor through which the bias current is generated, the voltage Vs on the read node complying with the following relationship:

$$Vs = Vtn(1 - R1/R11)$$

where Vtn is the threshold voltage, R1 is an impedance value of the impedance and R11 is a resistance value of the resistor.

19. A sense amplifier comprising:
a read node able to be coupled to a memory cell;
an active stage coupled to said read node;
a MOS selection transistor coupled to said read node and having a threshold voltage; and
an active circuit structured to maintain a voltage on the read node lower than said threshold voltage, the active circuit including:
   two transistors in series with each other and coupled to the read node; and
   a control circuit structured to maintain a potential difference between the gates of said two transistors.

20. A sense amplifier according to claim 19, comprising a control stage biased by a bias current, the control stage including an impedance having a bias current flowing through that determines a potential difference between the gate voltages applied to the first and second transistors.

21. A method of reading a memory cell comprising:
selecting the memory cell;
connecting the memory cell to a read node of a sense amplifier;
supplying a read current on the read node using a MOS transistor of the sense amplifier, the MOS transistor having a threshold voltage; and
maintaining a read voltage on the read node at a value lower than the threshold voltage, wherein maintaining the read voltage of the read node at a lower value than the threshold voltage comprises:
   arranging a first transistor and a second transistor in series in the sense amplifier, the second transistor being linked to the read node; and
   applying, to gate terminals of the first and second transistors, respective gate voltages having a controlled potential difference relative to each other.

22. A method according to claim 21 comprising:
biasing a control stage of the sense amplifier by a bias current; and
determining a potential difference between gate voltages of the first and second transistors and using an impedance through which the bias current flows.

23. A method according to claim 22 comprising generating the bias current flowing through the impedance independently from a current flowing through the active stage of the sense amplifier.

24. A method according to claim 23 wherein the bias current flowing through the impedance is generated through a resistor, the voltage Vs on the read node complying with the following relationship:

$$Vs = Vtn(1 - 1R1/R11)$$

where Vtn is the threshold voltage, R1 is an impedance value of the impedance and R11 is a resistance value of the resistor.

* * * * *